United States Patent [19]

Speraw et al.

[11] Patent Number: 5,018,982
[45] Date of Patent: May 28, 1991

[54] ADAPTER FOR STACKING PRINTED CIRCUIT BOARDS

[75] Inventors: Floyd G. Speraw, DeBary; Jay A. Meyer, Oviedo, both of Fla.

[73] Assignee: NCR Corporation, Dayton, Ohio

[21] Appl. No.: 558,038

[22] Filed: Jul. 25, 1990

[51] Int. Cl.⁵ .............................................. H01R 9/09
[52] U.S. Cl. .................................. 439/74; 174/138 D
[58] Field of Search ................... 439/65, 74, 75, 78; 361/412, 413; 174/138 D, 138 G

[56] References Cited

U.S. PATENT DOCUMENTS

| | | | |
|---|---|---|---|
| 3,179,913 | 4/1965 | Mittler et al. | |
| 3,196,318 | 7/1965 | Richardson | 317/101 |
| 3,212,049 | 10/1965 | Mittler et al. | |
| 3,225,263 | 12/1965 | Steenberg | 317/112 |
| 3,271,747 | 9/1966 | Harner et al. | 340/174 |
| 3,408,452 | 10/1968 | Ruehlemann | 174/68.5 |
| 3,568,001 | 3/1971 | Straus | 317/101 |
| 3,596,138 | 7/1971 | Lehrfeld | 439/74 X |
| 3,836,704 | 9/1974 | Coules | 174/138 |
| 4,149,764 | 4/1979 | Mattingly, Jr. | |
| 4,498,120 | 2/1985 | Kaufman | 361/412 X |
| 4,502,193 | 3/1985 | Harmon et al. | 174/138 D X |
| 4,640,639 | 2/1987 | Matsui | 174/138 D |
| 4,664,458 | 5/1987 | Worth | |
| 4,760,495 | 7/1988 | Till | 174/138 D X |
| 4,875,140 | 10/1989 | Delpech et al. | 361/412 |

Primary Examiner—Neil Abrams
Assistant Examiner—Khiem Nguyen
Attorney, Agent, or Firm—Wilbert Hawk, Jr.; Stephen F. Jewett; James M. Stover

[57] ABSTRACT

A standoff and retainer for use in mechanically and electrically connecting two or more printed circuit boards in a parallel spaced type arrangement. The metallic standoff is constructed in the form of a sleeve partially closed at one end. The plastic retainer is also formed in the shape of a sleeve but includes a male connector at one end. The standoff is attached to a printed circuit board by advancing the connector end of the retainer into the open end of the standoff until the connector snaps into engagement with the hole in the partially closed end wall of the standoff and a mounting hole in the printed circuit board.

3 Claims, 3 Drawing Sheets

ADAPTER FOR STACKING PRINTED CIRCUIT BOARDS

The present invention relates to apparatus for electrically and mechanically interconnecting printed circuit boards and, more particularly, to a snap-on standoff for stacking printed circuit boards.

BACKGROUND OF THE INVENTION

Printed circuit boards in electronic devices such as computer workstations and personal computers are often stacked together in a parallel arrangement to reduce cabinet and board size, to accommodate cabinet design, or as a result of modular design practices. In addition, printed circuit boards are often added to existing logic circuits to provide additional features or improved functionality to the circuit. Examples of such additional printed circuit boards include drivers for color monitors, additional memory, communication boards and disk drive controllers.

Existing methods of connecting stacked printed circuit boards include the use of metallic standoffs which are pressed into or soldered into the printed circuit boards. The standoffs and boards are often aligned on straight metallic posts. The use of metal standoffs is advantageous in that it provides an electrical connection between the boards in addition to the mechanical connection. Unfortunately, stacked boards assembled with metal standoffs as described above are difficult to disassemble should the need arise to add, replace, remove or repair a printed circuit board.

Alternatively, nylon standoffs that snap onto the printed circuit boards have been utilized to stack boards. Although nylon standoffs greatly simplify assembly and disassembly of connected circuit boards, they cannot provide an electrical connection between stacked boards. Neither the metal nor nylon standoffs currently in use allow additional printed circuit boards to be simply and inexpensively attached to existing boards or stacks not designed to permit attachment of additional boards.

OBJECTS OF THE INVENTION

It is therefore an object of the present invention to provide a new and improved means for stacking printed circuit boards not subject to the foregoing disadvantages.

It is another object of the present invention to provide such a stacking means which permits easy assembly and disassembly of a stack of printed circuit boards.

It is yet another object of the present invention to provide such a stacking means which provides an electrical connection between the circuit boards.

It is still a further object of the present invention to provide a simple and inexpensive snap-on standoff for electrically and mechanically connecting printed circuit boards in a parallel spaced type relationship.

It is an additional object of the present invention to provide a means for mechanically and electrically connecting one or more additional printed circuit boards onto an existing board mounted in an electronics cabinet.

SUMMARY OF THE INVENTION

There is provided, in accordance with the present invention, a standoff and retainer for use in electrically and mechanically connecting printed circuit boards together in a parallel spaced type arrangement. The standoff is formed of an electrically conductive material in the shape of a sleeve. An end wall having a hole therein is provided at one end of the sleeve.

The retainer is similarly formed in the shape of a sleeve having an external diameter less than the internal diameter of the standoff sleeve and having a length less than the length of the standoff sleeve. A male connector is provided at one end of the sleeve which forms the body of the retainer. The retainer is secured within the standoff by advancing the connector end of the retainer into the open end of the standoff until the connector engages with and protrudes from the hole in the end wall of the standoff. The portion of the connector protruding from the end of the standoff is utilized to attach the standoff to a mounting hole formed in a printed circuit board.

With several standoffs attached to a printed circuit board, this board car be easily stacked onto another board. The stack is securely fastened together by the use of mounting screws placed through the mounting holes in the top board, through the standoffs and through corresponding mounting holes in the lower board.

The above and other objects, features, and advantages of the present invention will become apparent from the following description and the attached drawings.

DETAILED DESCRIPTION OF THE PREFERRED EMBODIMENT

Figure 1:
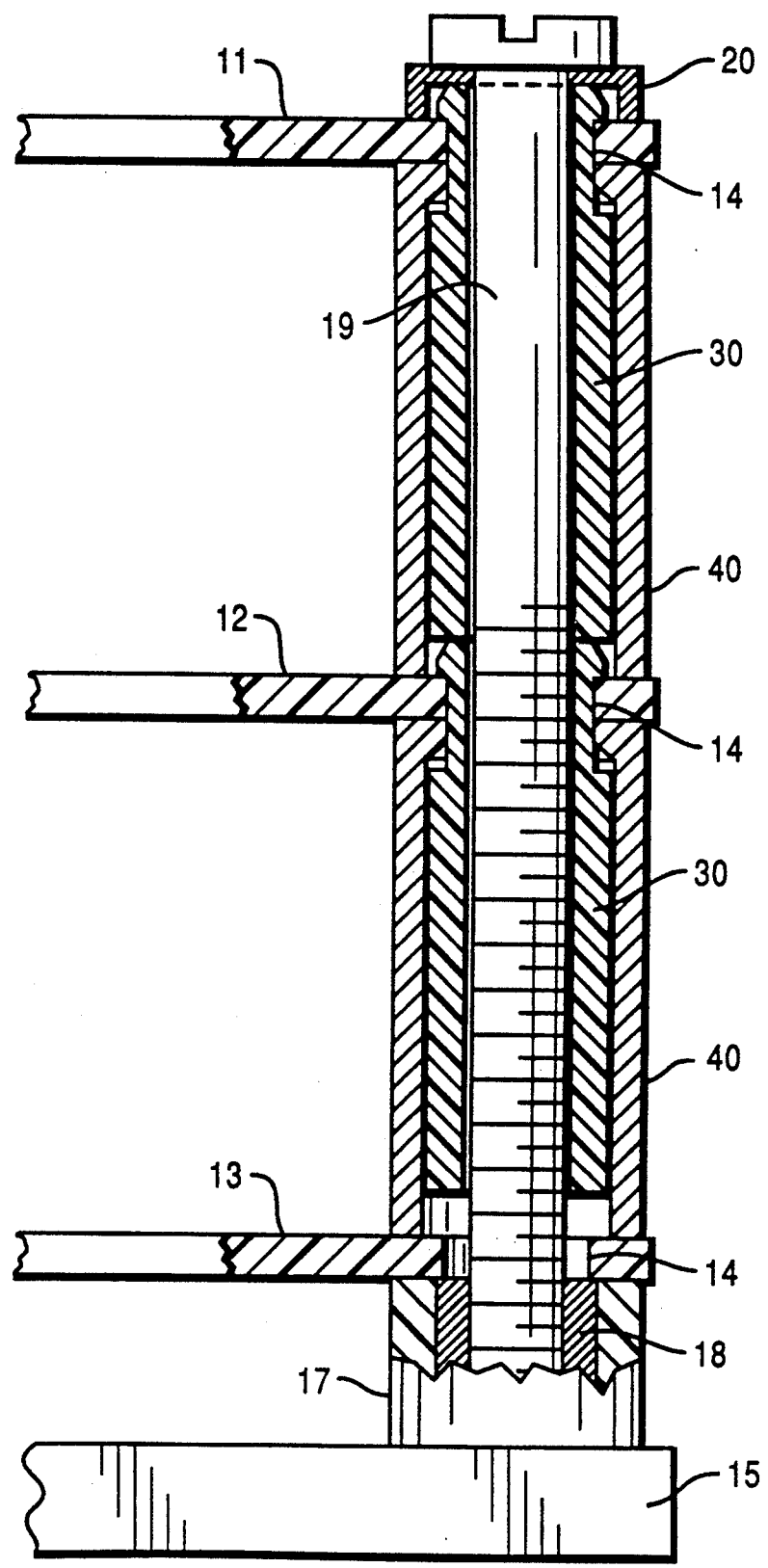
FIG. 1 is a vertical sectional view through a stack of printed circuit boards electrically and mechanically connected together in accordance with the present invention.

Referring now to FIG. 1, there is seen a vertical sectional view through a stack of three parallel spaced printed circuit boards 11, 12 and 13 electrically and mechanically connected together in accordance with the present invention. Each board contains a plated-through hole 14 which is coaxially aligned with the holes in the other two boards.

Figure 3:
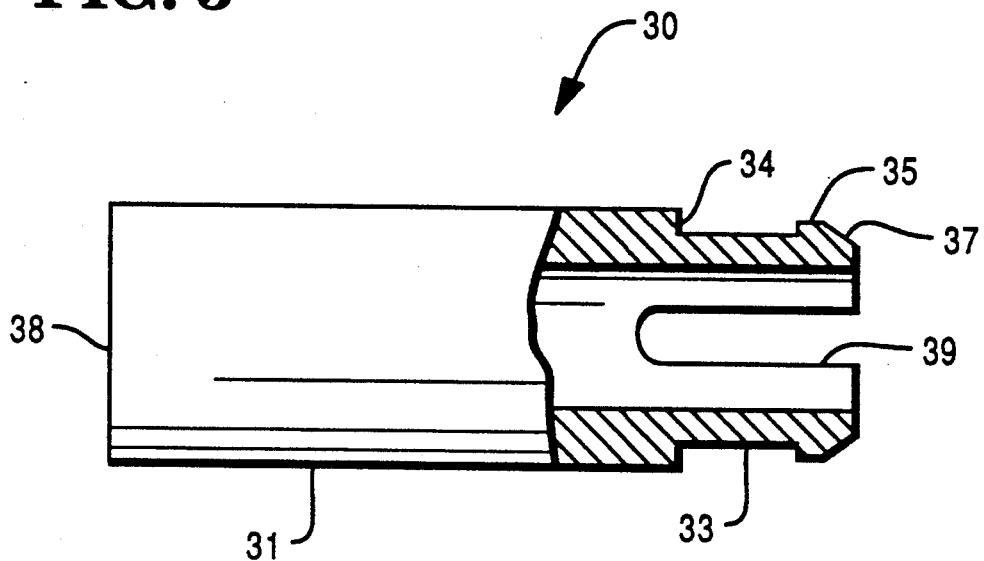
FIG. 3 is a side view, shown partially cut away, of the retainer shown in FIGS. 1 and 2.
Figure 4:
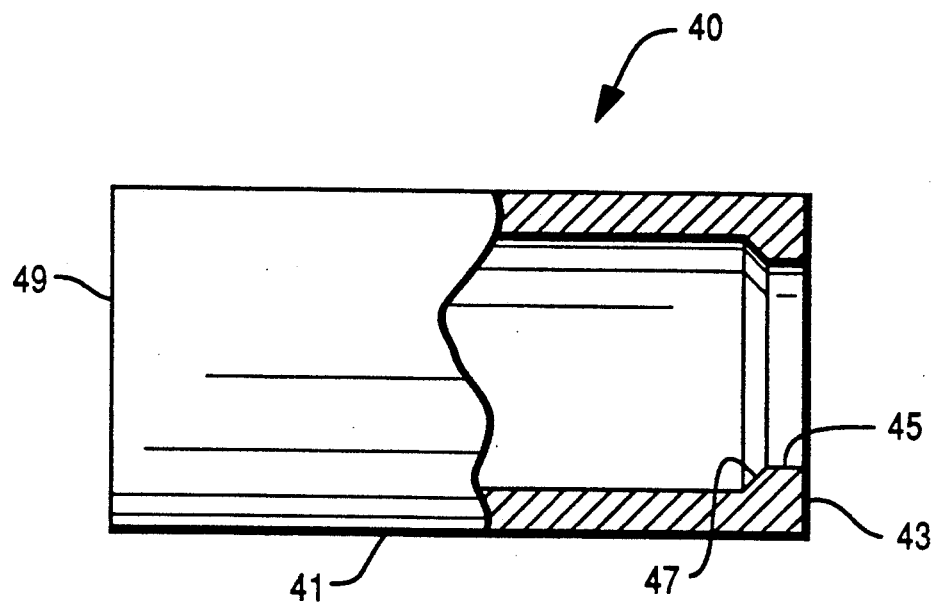
FIG. 4 is a side view, shown partially cut away, of the standoff shown in FIGS. 1 and 2.

Spacing between the boards is maintained by metallic standoff 40, which also provide electrical connection between adjacent printed circuit boards. Each standoff 40 is secured to a printed circuit board through the use of a nylon or plastic retainer 30. The construction of retainers 30 and standoff 40 are shown in FIGS. 3 and 4, respectively.

Circuit boards 11, 12 and 13, metallic standoff 40 and retainers 30 are secured together and mounted to cabinet base 15 by a screw 19 which traverses the column formed by the stacked standoff. The cabinet base includes supports 17, each support having a threaded insert 18 for receiving screw 19.

A screw cap 20 is disposed between the head of screw 19 and printed circuit board 11 to protect the portion of the topmost retainer which protrudes through hole 14 in board 11 and to firmly clamp board 11 to the stack.

Figure 2:
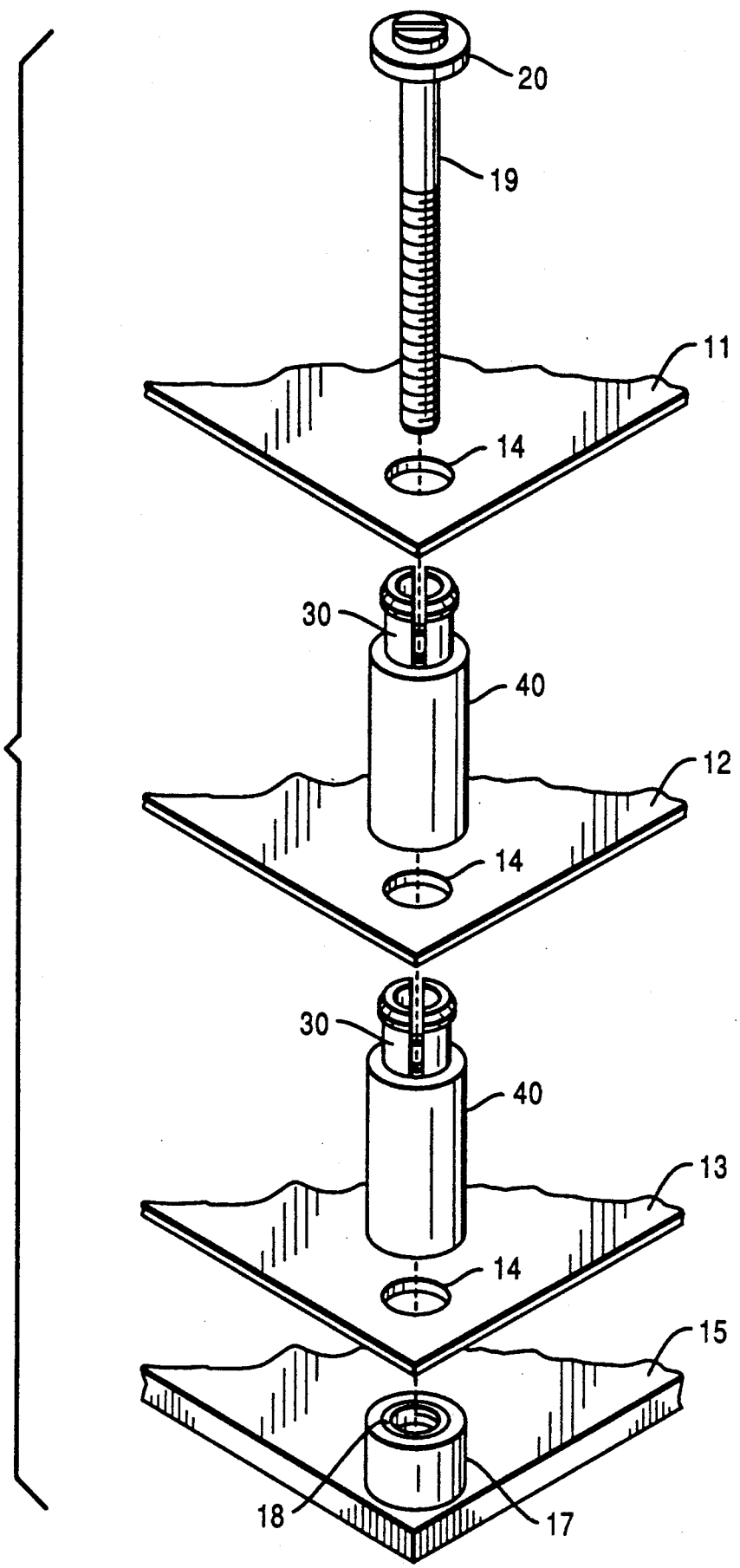
FIG. 2 is an exploded view of the support shown in FIG. 1 for connecting together multiple printed circuit boards.

The assembly of FIG. 1 is shown disassembled in FIG. 2 to provide a better understanding of the alignment of the holes in the circuit boards, standoff, retainers and cabinet base. The standoffs 40 and retainers 30 are not shown separated, however.

Retainer 30 is shown in side view, partially cut away, in FIG. 3. The body 31 of the retainer is formed from polycarbonate material in the shape of a sleeve having an inner diameter large enough to accommodate screw 19 and having, throughout most of its length, an outer diameter greater than the diameter of holes 14. One end of the retainer has a reduced outer diameter to form a male connector 33 for engagement with holes 14. A shoulder 34 is formed where the male connector is joined to the main body of the retainer. The male connector terminates in an enlarged portion 35 having a chamfered edge 37. Two cuts 39 extend from the male end of the retainer into the main body of the retainer, dividing the male connector into two identical halves. The cuts 39 permit inward deflection of the two halves during insertion or removal of the retainer from holes 14.

FIG. 4 is a side view, shown partially cut away, of standoff 40. The body 41 of the standoff is formed from aluminum or another electrically conductive material in the shape of a sleeve partially closed at one end 43. The internal diameter of the sleeve is slightly larger than the outer diameter of retainer 30. End 43 contains a hole 45 having a diameter equal to the diameter of holes 14. A chamfered surface 47 provides a transition from the internal surface of the sleeve to hole 45.

Retainer 30 is secured inside standoff 40 by inserting the male end of the retainer into end 49 of the standoff until the male connector engages with hole 45. The male connector has a length sufficient to engage with both hole 45 and one of holes 14. Chamfered surfaces 37 and 47 facilitate engagement of retainer 30 in standoff 40.

Referring again to FIGS. 1 and 2, printed circuit boards 11, 12 and 13 are stacked and secured together by engaging the male connectors protruding from the retainer/standoff assemblies into holes 14 so that the standoffs are held against the bottom surfaces of boards 11 and 12. The boards are then stacked so that the corresponding holes in boards 11, 12 and 13, the retainer/standoff assemblies and threaded support 17 are aligned coaxially. Screw 19 is inserted from the top of the stack through the boards and retainer/standoff assemblies into support 17.

It should be noted that the length of the retainer between shoulder 34 and end 38 is less than the length of the standoff between the chamfered surface 47 and end 49. This difference in length permits the placement of the upper retainer/standoff assembly over the end portion of the male connector which extends above board 12. Screw cap 20 protects the end portion of the male connector which extends above board 11.

It can thus be seen that there has been provided by the present invention an assembly for securing two or more printed circuit boards together in a parallel spaced type relationship, and securing the stack of boards to a cabinet base. In addition, the standoffs disposed between the boards provide an electrical connection between the boards. The connecting and spacing means are simply and inexpensively constructed and permit easy separation of the boards.

From the foregoing specification it will be clear to those skilled in the art that the present invention is not limited to the specific embodiment described and illustrated and that numerous modifications and changes are possible without departing from the scope of the present invention. For example, three circuit boards are shown in FIGS. 1 and 2. However, any number of boards which can be accommodated by the surrounding cabinetry can be stacked together utilizing the standoffs and retainers shown and described. The length of screw 19 will need to be varied in proportion with the height of the stack. In addition the dimensions, number and shapes of the retainers and standoffs utilized to connect boards together may be varied to accommodate different size boards and board components.

These and other variations, changes, substitutions and equivalents will be readily apparent to those skilled in the art without departing from the spirit and scope of the present invention. Accordingly, it is intended that the invention to be secured by Letters Patent be limited only by the scope of the appended claims.

What is claimed is:

1. Apparatus for mechanically connecting a plurality of printed circuit boards in a parallel arrangement, each of said printed circuit boards having an equivalent distribution of mounting holes, the apparatus comprising:

a standoff for placement between corresponding mounting holes of adjacent printed circuit boards, said standoff having a hole formed through its length, said hole being coaxial with a line drawn between the centers of said corresponding mounting holes, said standoff comprising a first cylindrical sleeve having an internal diameter greater than the diameter of said mounting holes and an end wall having a hole with a diameter equal to the diameter of said mounting holes; and a retainer for detachably connecting said standoff to one of said adjacent printed circuit boards, said retainer comprising a second cylindrical sleeve for insertion within said first sleeve, said second sleeve having a length less than the length of said first sleeve and having an external diameter less than the internal diameter of said first sleeve and greater than the diameter of said mounting holes, said retainer including a male connector formed at one end of said second sleeve for engagement with the hole in said end wall and one of said mounting holes, said retainer including a shoulder where said male connector is joined with said second sleeve, said retainer further including a hole formed through its length;

said male connector including:

an enlarged end portion; and two cuts extending along the length of the connector and dividing the connector into two identical halves;

whereby said cuts permit inward deflection of said connector halves during insertion or removal off said connector from said mounting holes or said standoff; and whereby said shoulder and said enlarged portion connect said standoff with a printed circuit board;

whereby said printed circuit boards are connected together by fastening means placed through said corresponding mounting holes and the lengthwise hole in said retainer.

2. The apparatus according to claim 1, wherein said standoff is comprised of an electrically conductive material to provide a conductive path between said adjacent printed circuit boards.

3. The apparatus according to claim 2, wherein said retainer is constructed from a polycarbonate material.

* * * * *